United States Patent
Hwang et al.

(10) Patent No.: US 6,184,129 B1
(45) Date of Patent: *Feb. 6, 2001

(54) LOW RESISTIVITY POLY-SILICON GATE PRODUCED BY SELECTIVE METAL GROWTH

(75) Inventors: Ming Hwang; Jiong-Ping Lu, both of Dallas; Duane E. Carter, Plano; Wei-Yung Hsu, Dallas, all of TX (US)

(73) Assignee: Texas Instruments Incorporated, Dallas, TX (US)

(*) Notice: Under 35 U.S.C. 154(b), the term of this patent shall be extended for 0 days.

This patent is subject to a terminal disclaimer.

(21) Appl. No.: 09/405,265

(22) Filed: Sep. 23, 1999

Related U.S. Application Data

(60) Provisional application No. 60/111,907, filed on Dec. 10, 1998, and provisional application No. 60/102,244, filed on Sep. 29, 1998.

(51) Int. Cl.[7] .................................................. H01L 21/48
(52) U.S. Cl. ....................... 438/653; 438/197; 438/585; 438/643; 438/647; 438/648; 438/649; 438/655
(58) Field of Search ................................ 438/197, 647, 438/585, 643, 648, 649, 653, 655

(56) References Cited

U.S. PATENT DOCUMENTS

| | | | |
|---|---|---|---|
| 5,027,185 | * | 6/1991 | Liauh .................................. 357/59 |
| 5,336,903 | * | 8/1994 | Ozturk et al. ...................... 257/19 |
| 5,381,302 | * | 1/1995 | Sandhu et al. ..................... 361/305 |
| 5,912,487 | * | 6/1999 | Hong .................................. 257/315 |

* cited by examiner

Primary Examiner—Charles Bowers
Assistant Examiner—Lisa Kilday
(74) Attorney, Agent, or Firm—Peter K. McLarty; W. James Brady, III; Frederick J. Telecky, Jr.

(57) ABSTRACT

A method for fabricating a low resistivity polymetal silicide conductor/gate comprising, the steps of forming a polysilicon (66) over a gate oxide (64) followed by protection of the polysilicon (66) with a sacrificial material (68), is disclosed. Gate sidewalls (70) are created to protect the sides of the polysilicon (66) and the sacrificial material (68), followed by stripped the sacrificial material (68) to expose the top surface of the polysilicon (66). Next, a diffusion barrier (76) is deposited over the exposed polysilicon (66) and a metal layer (78) is selectively grown on the diffusion barrier (76) to form a gate contact and conductor. Finally, a dielectric layer (80) is deposited over the selectively grown metal layer (78), the sidewalls (70) and the gate oxide (64).

20 Claims, 4 Drawing Sheets

LOW RESISTIVITY POLY-SILICON GATE PRODUCED BY SELECTIVE METAL GROWTH

This application claims priority under 35 USC §119(e)(1) of Provisional Application No. 60/111,907 filed Dec. 10, 1998 and Provisional Special Application No. 60/102,244 filed Sep. 29, 1998.

TECHNICAL FIELD OF THE INVENTION

The present invention relates in general to the field of integrated circuits, and more particularly, to the fabrication of semiconductor integrated circuit gates having a low resistivity polymetal silicide.

BACKGROUND OF THE INVENTION

Without limiting the scope of the invention, its background is described in connection with the formation of polysilicon containing conductor gates, as an example.

As is well known in the art of integrated circuit design, layout and fabrication, the manufacturing cost of a given integrated circuit is largely dependent upon the chip area required to implement desired functions. The chip area is defined by the geometries and sizes of the active components disposed in the wafer substrate. Active components include gate electrodes in metal-oxide semiconductors (MOS) and diffused regions such as MOS source and drain regions and bipolar emitters, collectors and base regions.

SUMMARY OF THE INVENTION

What is needed is a structure and method for using current integrated circuit processing techniques and manufacturing equipment that meet the demands of VLSI and ULSI integrated circuits. One particular area of need is for a low resistivity polymetal silicide conductor/gate. The polymetal silicide conductor/gate should be reliable and formed using existing equipment. Metal as used and defined herein is meant to include metal silicides.

Also needed is a polymetal silicide conductor/gate that is obtained using a simplified process flow and in which the oxidation of the metal layer is reduced. Finally, a need has arisen for a simplified process for forming a polymetal silicide conductor/gate that is economical to make using existing techniques and materials.

One embodiment of the present invention is directed to a method of fabricating a polymetal silicide conductor/gate comprising, forming polysilicon and sacrificial material into a conductor and a gate over a gate oxide. A sacrificial material may be made with, e.g., silicon nitride or phosphosilicate glass (PSG). Gate sidewalls can also be created to protect the sides of the polysilicon and the sacrificial material. The sacrificial material is stripped to expose the top surface of the polysilicon and a diffusion barrier is deposited over the exposed polysilicon. Following deposition of the diffusion barrier, a metal layer is selectively grown on the diffusion barrier to form a gate contact. Finally, a dielectric layer is deposited over the selectively formed metal and the gate oxide.

In one embodiment of the present invention the diffusion barrier that is deposited over the exposed polysilicon is made by depositing tungsten nitride on the exposed polysilicon and annealing the tungsten nitride to form a tungsten silicon nitride. In another embodiment of the invention, the step of forming a diffusion barrier over the exposed polysilicon comprises the steps of, depositing titanium on the exposed polysilicon to form a titanium silicide, removing the excess unreacted titanium with a titanium selective etch and exposing the titanium silicide to a nitrogen plasma to form a titanium silicon nitride. Yet another method of depositing a diffusion barrier over the exposed polysilicon comprises the steps of forming a titanium silicide layer on the exposed polysilicon by reacting the exposed surface with titanium tetrachloride in the presence of silane.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

(Note: These figures are simplified as field oxide, source/drains, adjacent wordlines and moats have been omitted for ease of discussion.)

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

In particular, a DRAM cell that may or may not be embodied in another type of device, such as a digital signal processor, is used to illustrate the invention, but the invention can be used in other types of memory, or non-memory circuits.

Figure 1:
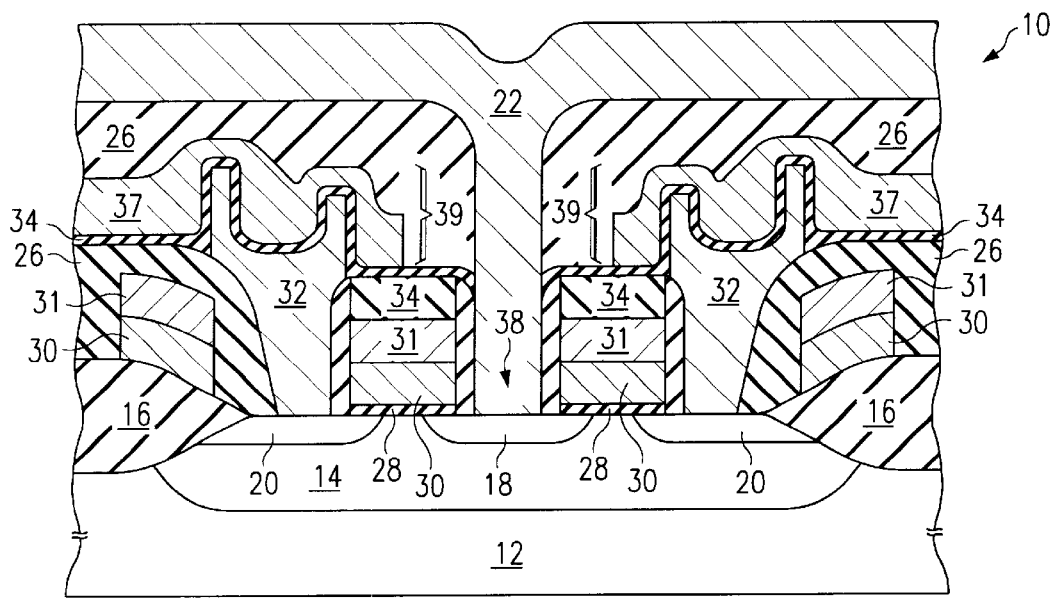
FIG. 1 is a simplified cross-sectional view of a polymetal silicide conductor/gate that in this example is part of a DRAM cell.

The general features of a fully assembled pair of polymetal silicide conductor/gates that are part, in this example, of DRAM cells which are generally designated as 10 shown as a simplified cross-sectional view in FIG. 1. The DRAM cells 10 have a substrate 12 that is formed having a conductivity type which is one of either a P-type conductivity or a N-type conductivity, if the substrate 12 is silicon based. Substrate 12 may be made of silicon, gallium arsenide, silicon on insulator (SOI) structures, epitaxial formations, germanium, germanium silicon, polysilicon, amorphous silicon, and/or like substrate, semi-conductive or conductive. The substrate 12 is typically made of single crystal silicon, and is usually lightly doped with boron, phosphorous or arsenic atoms.

A active area or moat 14 is shown disposed within a field oxide region 16, the field oxide 16 has been, e.g., grown from substrate 12 or confined by a shallow trench isolation (not shown). The moat region 14, generally formed by diffusion, has disposed therein storage source/drain regions 20. The common source/drain 18 (common to both cells), also located within moat 14, is connected to bitline contact 38 that is etched through an insulating layer 26.

Disposed adjacent to the storage source/drain regions 20, and the common source/drain 18, are a gate oxides 28, polysilicon 31 and silicide 32, collectively wordlines. Portions of the wordlines also function as gates (thus, the "wordlines" are conductor/gates), of the field effect transistors (FET) of the DRAM cells 10. The storage nodes 32 (which form one of the capacitor plates) of the DRAM cells 10 are electrically connected to the storage source/drains regions 20. A storage node 32, a dielectric layer 34 disposed over the storage node 32, the wordline 30 and below grounded upper plate 37 form the capacitor 39. The various components of the DRAM cell 10 are electrically isolated by insulating layers 26. The storage nodes 36, which include storage node contacts, area generally "wine glass" shaped, with an upper "bowl" and a "stem" below.

Figure 2:
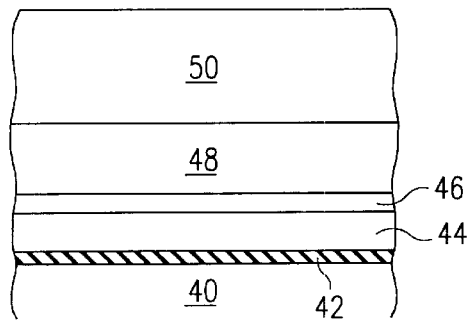
FIGS. 2 and 3 show cross-sectional views of the formation of a gate of the prior art.

FIG. 2 depicts the first steps in the prior art method for the formation of a metal containing gate. On a silicon substrate 40 is grown a silicon dioxide layer 42. A polysilicon layer 44 is deposited on the silicon dioxide layer 42, followed by forming a diffusion barrier 46, such as a titanium nitride ($TiN_x$) or tungsten nitride ($WN_x$). On the diffusion barrier 46 is deposited a metal 48, such as tungsten followed by the deposition of a silicon nitride ($Si_3N_4$) layer 50.

Figure 3:
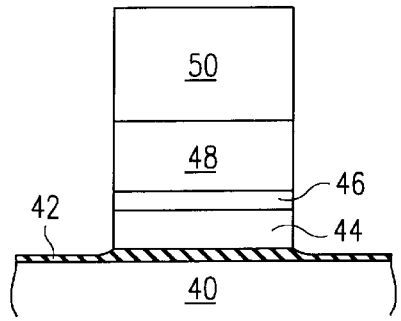

FIG. 3 shows the next step in the prior art process for making a metal containing gate. After lithographic patterning and etching a gate stack having the above described layers is shown. The etching, especially of the barrier, however, causes damage, especially to the metal. Also to abstract and summary but exposing the metal to oxidation damage. Further during the etching process, the top portion of the silicon dioxide layer 42 is damaged, generally requiring an oxidation to repair damage to the oxide gate but exposing the metal to oxidation damage.

The process shown in FIGS. 2 and 3 exposes the entire wafer to etch chemicals and etching byproducts, (especially byproducts of etching the metal). Further, the gate/conductor metal is damaged by the oxidation step and the diffusion barrier etchant. Alternative ways of making the gate stack of the prior art form the gate without a post etching oxidation step, but such processes fail to repair the damage to the silicon dioxide layer 42 and do not avoid exposing the metal of the gate/conduct or to a barrier layer etchant.

Figure 4:
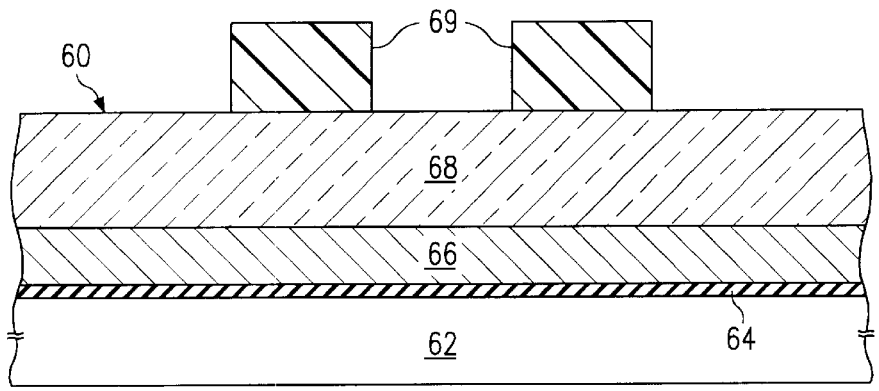
FIG. 4 through 11 show the layers and structures used to form a polymetal silicide conductor/gate of the present invention.

FIG. 4 shows a cross-sectional view of the first step in the formation of a polymetal silicide containing gate. A silicon substrate 62 has thereon a silicon dioxide layer 64 (typically a thermally grown oxide). A polysilicon 66 is disposed on a portion of the silicon dioxide layer 64, as is a sacrificial material 68, which can be, e.g., a nitride or a phosphosilicate glass (PSG). Photolithographic patterning 69 is depicted on sacrificial layer 68 prior to etching.

Figure 5:
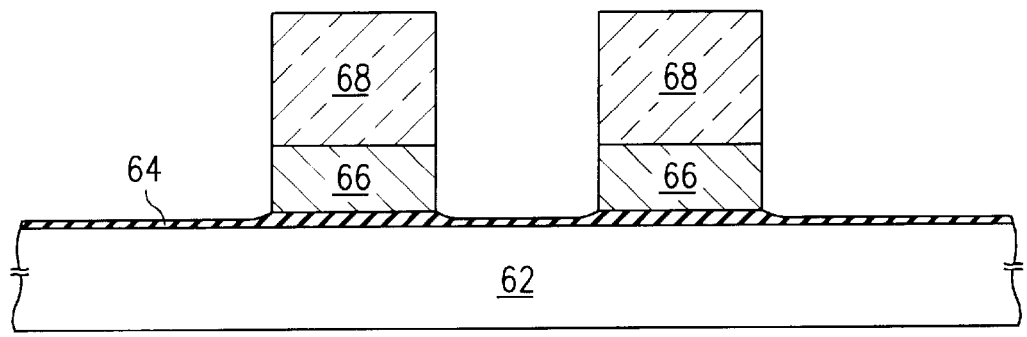

FIG. 5 shows the next step in the formation of the polymetal silicide conductor/gate. Following removal of the photoresist 69, a high temperature oxidation step has repaired the silicon dioxide layer 64 to compensate for damage caused by the etching of the gate. The shape of the polymetal gate is provided by polysilicon 66 and sacrificial material 68 as patterned and is generally designated 60.

Figure 6:
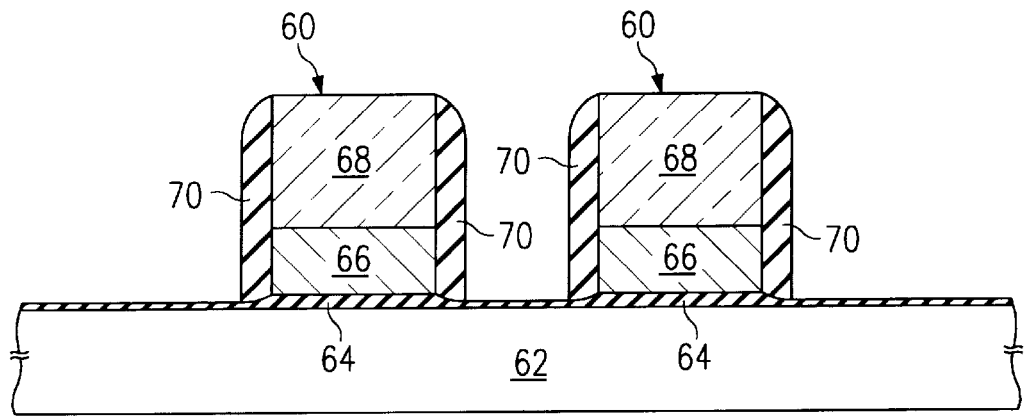

FIG. 6 shows the next step in the formation of the polymetal silicide conductor/gate, in which two adjacent polymetal silicide conductor/gates are shown to display the interaction and relative position of subsequent components. An isotropic deposition of a silicon dioxide layer (by, e.g., chemical vapor deposition) and anisotropic etching, are used to form gate sidewalls 70 on the sides of the gates. At this point the source/drains (not shown) of the gate can be implanted. Following source/drain implantation, in this embodiment, polysilicon is deposited over the entire surface of the wafer to a thickness above the gates. A polysilicon plug 72 is formed between the gates by patterning photoresist over the polysilicon plug 72 and etching away the excess polysilicon.

Figure 7:
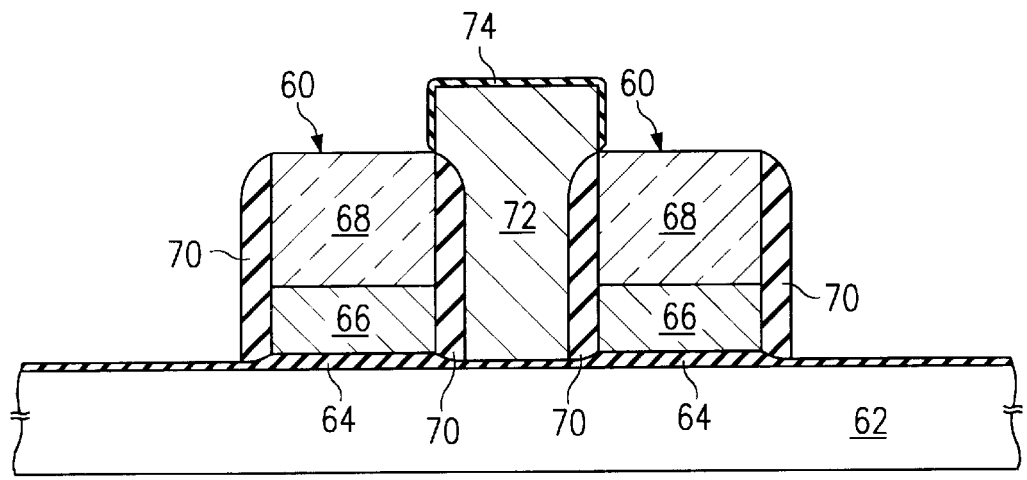

As shown in FIG. 7, the entire surface of the wafer is oxidized and a layer of oxide 74 is grown from and surrounding the polysilicon plug 72. While the sides of the polysilicon plug 72 in contact with the sidewalls 70 are not oxidized; the top and the sides of the polysilicon plug 72 that are exposed between the gates will be oxidized to form a thin silicon dioxide layer 74. The thin silicon dioxide layer 74 serves to protect the polysilicon plug 72 during subsequent etching steps, in particular when the sacrificial material 68 is phosphosilicate glass (PSG).

Figure 8:
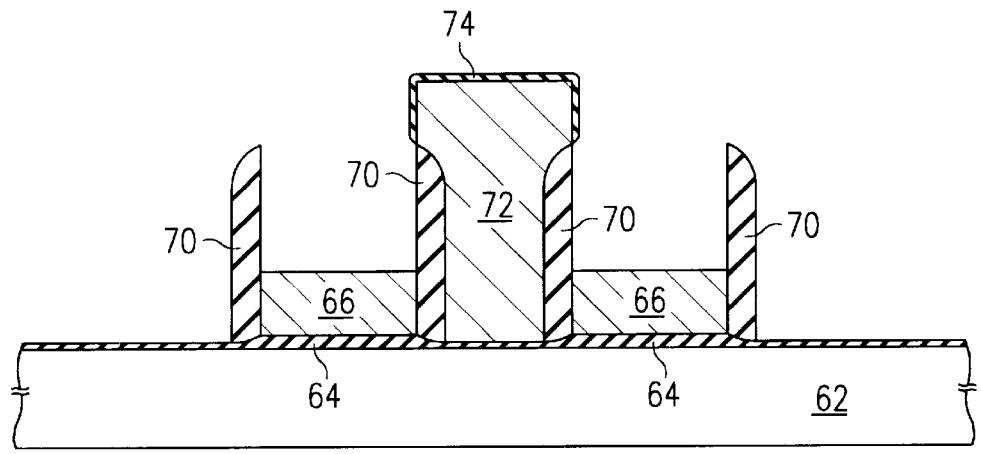

When using a hydrofluoric acid (HF) based etching of PSG, the difference in the rate of etch between thermal oxide and PSG allows for the removal of the sacrificial material 68, as depicted in FIG. 8. Alternatively, if a nitride layer is used as the sacrificial material 68 a wet/dry nitride strip can be used, e.g., a phosphoric acid etch. A light oxide etch may be used before the nitride strip to remove any oxynitride that is present on the surface of the nitride to improve the nitride strip. It can be seen that the polysilicon plug 72 helps support the adjacent sidewalls 70 at this stage of fabrication, and this is one of the reasons that the use of polysilicon plugs is preferred. Preferably, polysilicon plugs are used wherever there are to be critical connections to source/drains.

Figure 9:
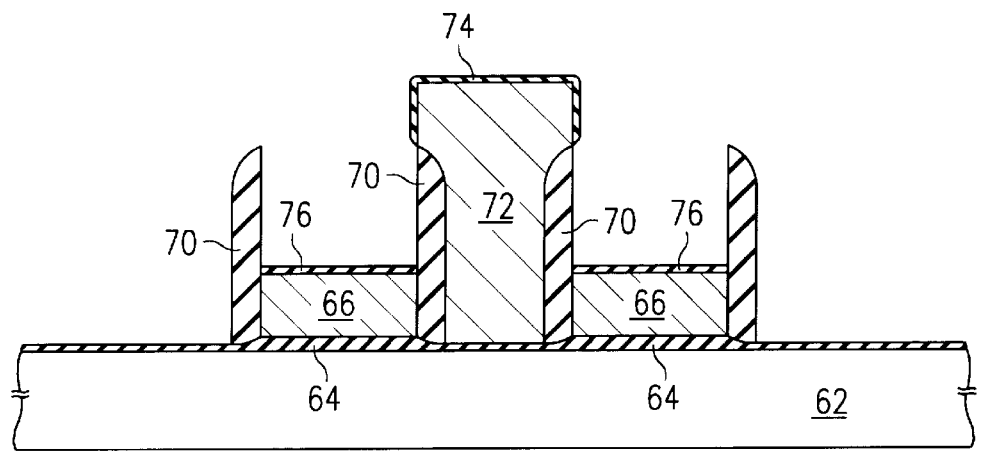

FIG. 9 shows the next structure in the process. A self-aligned diffusion barrier 76, e.g., a nitride, is formed on the polysilicon 66. The diffusion barrier 76 prevents the diffusion of metal atoms into the polysilicon 66 (and especially into the channel) in subsequent processing steps and during operation of the polymetal silicide conductor/gate. In one embodiment the diffusion barrier 76 can be, e.g., a thin layer of deposited tungsten nitride, which is then reacted with the silicon to form a tungsten silicon nitride ($WSi_xN_y$). Unreacted tungsten nitride (generally on oxide, rather than on silicon surfaces) is then removed using an etch that specifically removes the tungsten nitride from the oxide but not the tungsten silicon nitride. One example of such a selective tungsten nitride etch is a $H_2O_2$ wet etch that removes residual tungsten nitride from oxide.

Alternatively, titanium can be used as part of the diffusion barrier. For example, titanium can be deposited on the surface of the polysilicon 66, which reacts to form TiSi. Excess titanium is removed using an etch (e.g., $H_2O_2$/$NH_4OH$ solution etch), and the surface is exposed to a nitrogen plasma to form a diffusion barrier 76 of titanium silicon nitride ($TiSi_{xNy}$). Another example of a diffusion barrier 76 is to expose the surface of the polysilicon 66 to titanium tetrachloride ($TiCl_4$) in the presence of silane ($SiH_4$) leading to a selectively formed diffusion barrier of $TiSi_2$, that is available for selective growth of a metal gate.

Figure 10:
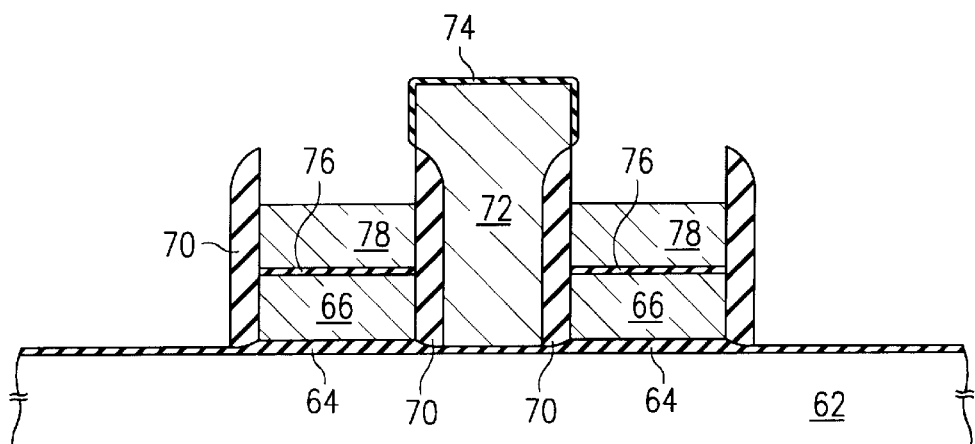

Following the formation of the diffusion barrier 76, metal is formed or grown on the diffusion barrier under selective growth conditions. For example, tungsten can be selectively formed on the diffusion barrier 76 to form gate contact 78 as shown in FIG. 10. Other examples of metals that can be selectively grown to form the gate contact 78 can be, e.g., titanium, cobalt or aluminum. The selective deposition of a metal to form the gate contact 78 without a subsequent high temperature oxidation or anneal permits the formation of a reliable gate using established nitride, polysilicon and phosphosilicate glass technology. By elimination the need to expose the metal of gate contact 78 to an oxidating environment, a gate contact 78 with a low resistivity or resistance per unit length, can be deposited over the polysilicon 66 to form, e.g., a highly electrically conductive reroute line using the polymetal silicide conductor/gate structure.

In one example, the present invention allows for the formation of polymetal silicide conductor/gates that are part of wordlines that extend through a field of DRAM cells edge to edge. The formation of the low resistivity gate contact 78, as disclosed herein, also permits for the formation of a reliable polymetal silicide conductor/gate by eliminating the damage to metal by barrier etchants.

Figure 11:
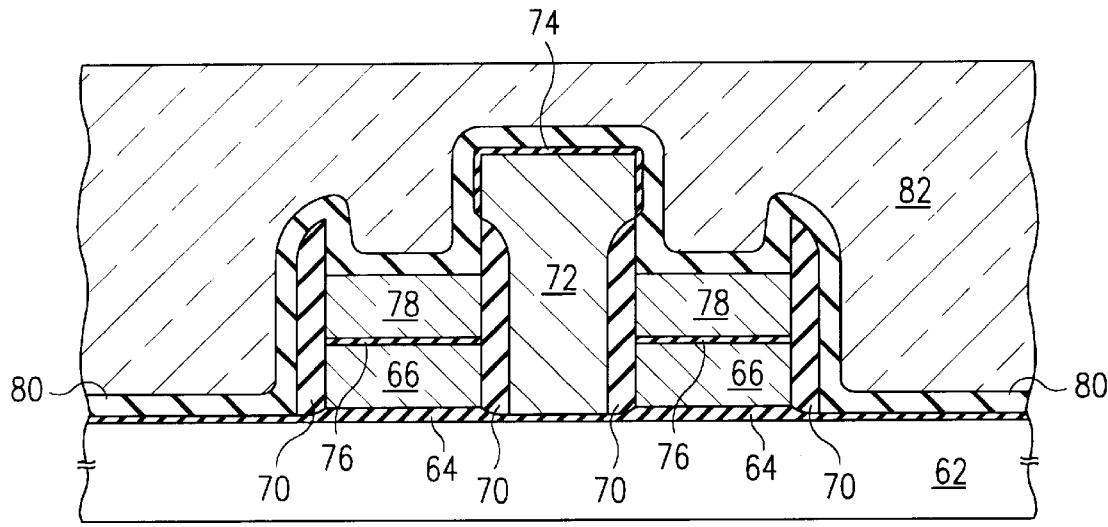

FIG. 11 shows how the polymetal silicide conductor/gate 60 is protected from oxidation during the subsequent processing of the polymetal silicide conductor/gate as part of an integrated circuit. A layer of silicon oxide 80 is blanket deposited using, e.g., low pressure chemical vapor deposition (LPCVD) tetraethoxysilane (TEOS). Following deposition of the silicon oxide layer 80, boro-phospho silicate glass (BPSG) that can be deposited, reflowed and planarized (e.g., to expose and thus allow contact to the top of the polysilicon plug) using chemical-mechanical polishing (CMP) before further processing. An example of further processing is the formation of a DRAM cell, in which the polysilicon plug 72 can be used as the bitline contact 38 to a drain 18, while the source/drains 20 of the polymetal silicide conductor/gates are connected to capacitors 39 through storage node contacts 32 (see also FIG. 1).

Figure 12:
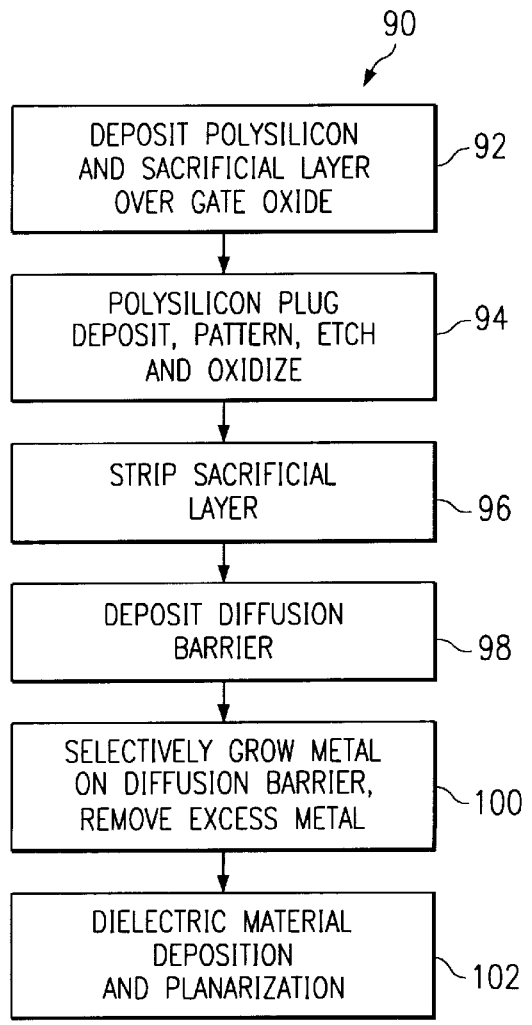
FIG. 12 is a flow diagram of a process of making a polymetal silicide conductor/gate.

FIG. 12 is a flow chart of basic steps for the fabrication of the polymetal silicide conductor/gate, and is generally designated 90. In step 92, polysilicon 66 is deposited over a gate oxide 64, followed by the deposition of a sacrificial material 68 (see also FIG. 4). In step 94, following patterning and etching of the gate, a polysilicon plug 72 or contact is deposited, patterned, etched and its exposed surface along with the entire wafer is exposed to oxidizing conditions (see also FIG. 7). Next, in step 96, the sacrificial material 68 is stripped or removed using, e.g., a wet, dry or a combination etch (see also FIG. 8). In step 98, a diffusion barrier 76 is formed on the surface of the polysilicon 66, which prevents diffusion of metal in subsequent processing and permits improved selective growth of a metal conductive layer (see also FIG. 9).

In step 100, a metal is selectively grown on the diffusion layer 76 to form the upper portion of the gate contact 78 (and the upper portion of conductors, e.g., wordlines, see also FIGS. 1 and 10). The excess metal can be removed using a selective etch, e.g., an $H_2O_2/NH_4OH$ etch for unreacted titanium. Finally, in step 102, a dielectric material is blanket deposited over the entire wafer surface to cover the metal of the gate contact 78, followed by the deposition, reflow and/or planarization of the dielectric layer (see also FIG. 11).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. For example, the use of the polysilicon plus is preferred, but not required. It is therefore intended that the appended claims encompass any such modifications or embodiments.

What is claimed is:

1. A method of fabricating a polymetal silicide conductor/gate comprising:

forming polysilicon and sacrificial material into a gate and conductor pattern over a gate oxide;

stripping said sacrificial material to expose the top surface of said polysilicon;

forming a diffusion barrier over said exposed polysilicon;

selectively forming a metal on said diffusion barrier; and depositing a dielectric layer over said metal and said gate oxide.

2. The method of claim 1, wherein said sacrificial material is silicon nitride.

3. The method of claim 1, wherein said sacrificial material is phosphosilicate glass.

4. The method of claim 1, wherein said step of forming a diffusion barrier over said exposed polysilicon comprises the steps of:

depositing tungsten nitride on said exposed polysilicon; and annealing said tungsten nitride to form a tungsten silicon nitride.

5. The method of claim 1, wherein said step of forming a diffusion barrier over said exposed polysilicon comprises the steps of:

depositing titanium on said exposed polysilicon to form a titanium silicide;

removing the excess unreacted titanium with a titanium selective etch; and exposing said titanium silicide to a nitrogen plasma to form a titanium silicon nitride.

6. The method of claim 1, wherein said step of forming a diffusion barrier over said exposed polysilicon comprises the steps of:

forming a titanium silicide layer on said exposed polysilicon by reacting the exposed surface with titanium tetrachloride in the presence of silane.

7. The method of claim 1, wherein in the step of selectively forming a metal gate contact on said diffusion barrier the metal selectively grown on said diffusion barrier is tungsten.

8. The method of claim 1, wherein in the step of selectively forming a metal gate contact on said diffusion barrier the metal selectively grown on said diffusion barrier is titanium.

9. The method of claim 1, wherein in the step of selectively forming a metal gate contact on said diffusion barrier the metal selectively grown on said diffusion barrier is aluminum.

10. A method of fabricating a polymetal silicide conductor/gate comprising:

forming polysilicon and sacrificial material into a gate and conductor pattern over a gate oxide;

creating gate sidewalls that protect the sides of said polysilicon and sacrificial material;

implanting the source and drain for said polysilicon;

stripping said sacrificial material to expose said polysilicon;

forming a diffusion barrier over said exposed polysilicon; and selectively forming a conductive metal on said diffusion barrier.

11. The method of claim 10, wherein said sacrificial material is silicon nitride.

12. The method of claim 10, wherein said sacrificial material is phosphosilicate glass.

13. The method of claim 10, wherein said step of forming a diffusion barrier over said exposed polysilicon comprises the steps of:

depositing tungsten nitride on said exposed polysilicon; and annealing said tungsten nitride to form a tungsten silicon nitride.

14. The method of claim 10, wherein said step of forming a diffusion barrier over said exposed polysilicon comprises the steps of:

depositing titanium on said exposed polysilicon to form a titanium silicide;

removing the excess unreacted titanium with a titanium selective etch; and exposing said titanium silicide to a nitrogen plasma to form a titanium silicon nitride.

15. The method of claim 10, wherein said step of forming a diffusion barrier over said exposed polysilicon comprises the steps of:

forming a titanium silicide layer on said exposed polysilicon by reacting the exposed surface with titanium tetrachloride in the presence of silane.

16. The method of claim 10, wherein in the step of selectively forming a conductive metal gate contact on said diffusion barrier the metal selectively grown on said diffusion barrier is tungsten.

17. The method of claim 10, wherein in the step of selectively forming a conductive metal gate contact on said diffusion barrier the metal selectively grown on said diffusion barrier is titanium.

18. The method of claim 10, wherein in the step of selectively forming a conductive metal gate contact on said diffusion barrier the metal selectively grown on said diffusion barrier is aluminum.

19. A method of fabricating a polymetal silicide conductor/gate for embedded memory comprising:

patterning polysilicon and sacrificial material into gates and conductors over a gate oxide;

creating gate sidewalls that protect the sides of said polysilicon and sacrificial material;

implanting the sources and drains for said gates;

patterning a polysilicon plug between said polysilicon sidewalls;

oxidizing exposed surfaces of said polysilicon plug;

stripping said sacrificial material from said polysilicon;

forming diffusion barriers over said exposed polysilicon;

selectively forming a depositable conductive metal gate contact on said diffusion barriers; and depositing a dielectric layer over said metal, said sidewalls and said gate oxide.

20. The method of claim 19, wherein said conductive metal is further defined as titanium, tungsten or aluminum.

* * * * *